United States Patent [19]

Navarro et al.

[11] Patent Number: 4,536,760

[45] Date of Patent: Aug. 20, 1985

[54] SIGNAL-ENVELOPE DISPLAY SYSTEM FOR A DIGITAL OSCILLOSCOPE

[75] Inventors: Luis J. Navarro; Joseph R. Peter; Bruce W. Blair, all of Beaverton, Oreg.

[73] Assignee: Tektronix, Inc., Beaverton, Oreg.

[21] Appl. No.: 434,459

[22] Filed: Oct. 15, 1982

[51] Int. Cl.³ ............................ G09G 1/00; G09G 3/00
[52] U.S. Cl. ..................................... 340/722; 340/798; 324/121 R
[58] Field of Search ............... 340/722, 739, 740, 798, 340/799; 324/121 R; 371/16

[56] References Cited

U.S. PATENT DOCUMENTS

| | | | |
|---|---|---|---|
| 4,251,815 | 2/1981 | Dagostino | 340/722 |
| 4,271,486 | 6/1981 | Dagostino et al. | 365/45 |
| 4,396,912 | 8/1983 | Pozzi | 340/739 X |

Primary Examiner—Gerald L. Brigance
Assistant Examiner—Vincent P. Kovalick
Attorney, Agent, or Firm—George T. Noe

[57] ABSTRACT

A signal-envelope display system for a digital oscilloscope includes a memory for storing minimum and maximum signal values in adjacent storage locations, an address counter for sequentially addressing the memory, and a control circuit for selectively inverting the least significant bit of the address count signal. The values retrieved from the memory are converted to analog values and a low-pass filter connects the analog values to provide a signal envelope display.

5 Claims, 8 Drawing Figures

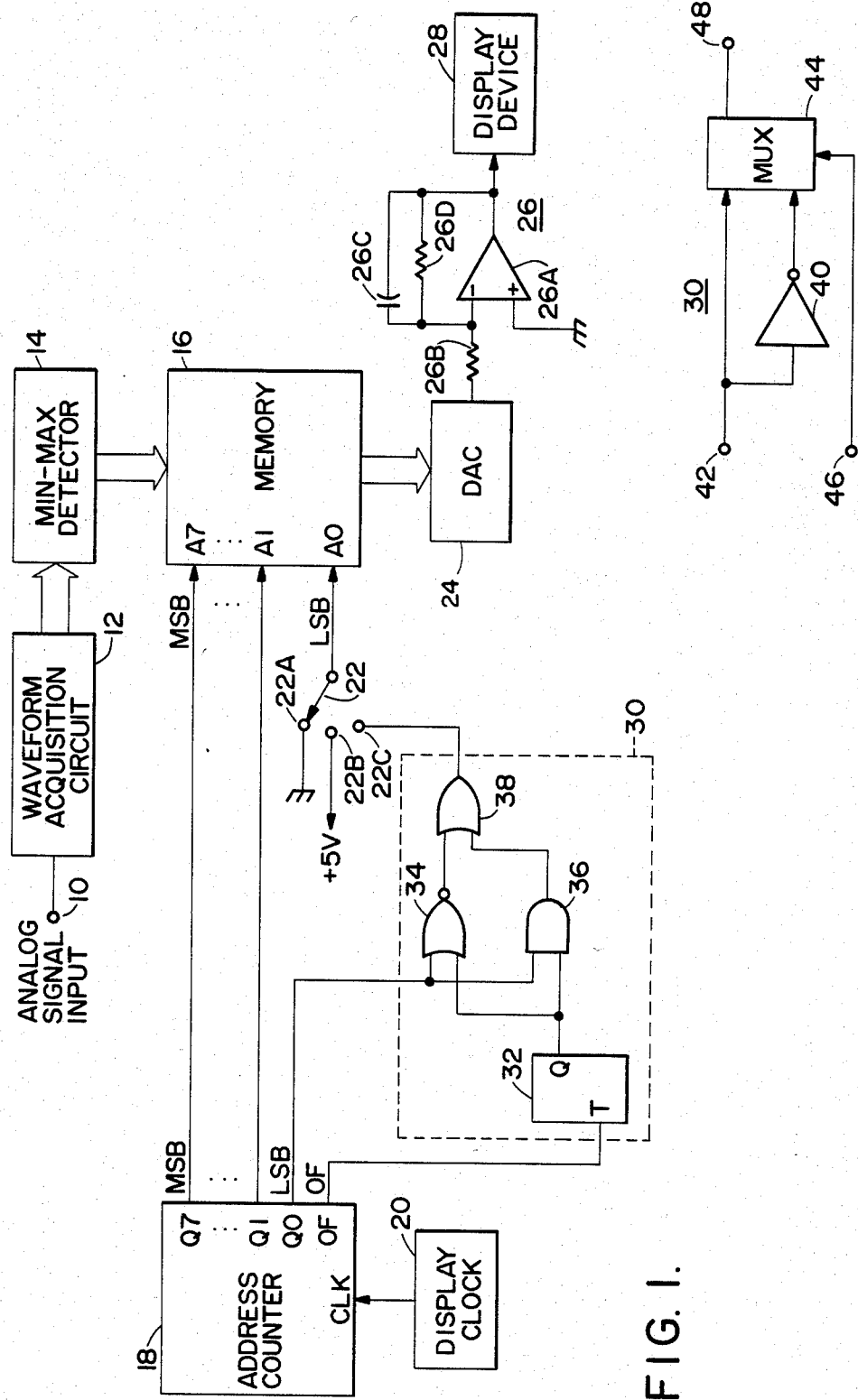

FIG. 2A.
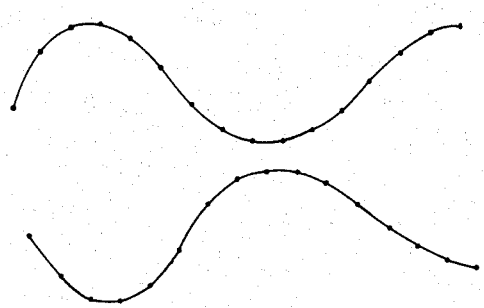
FIG. 2B.
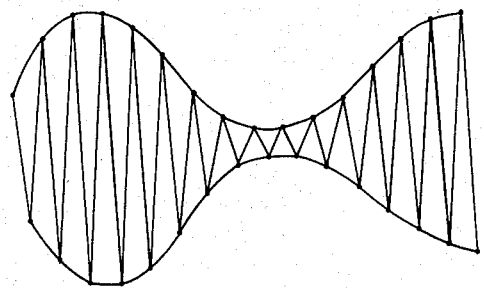
FIG. 2D.
FIG. 2C.
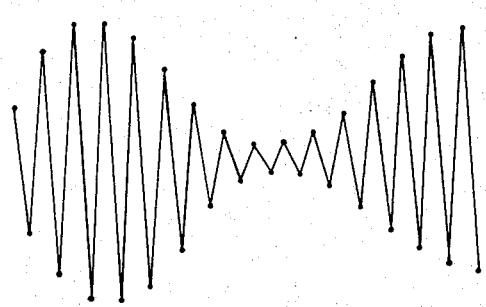
FIG. 2E.
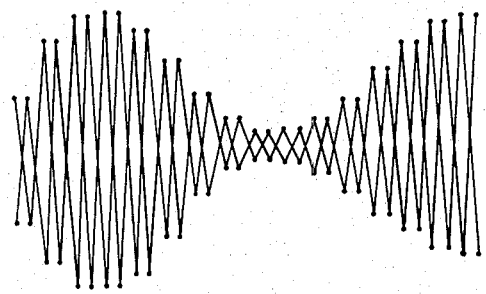
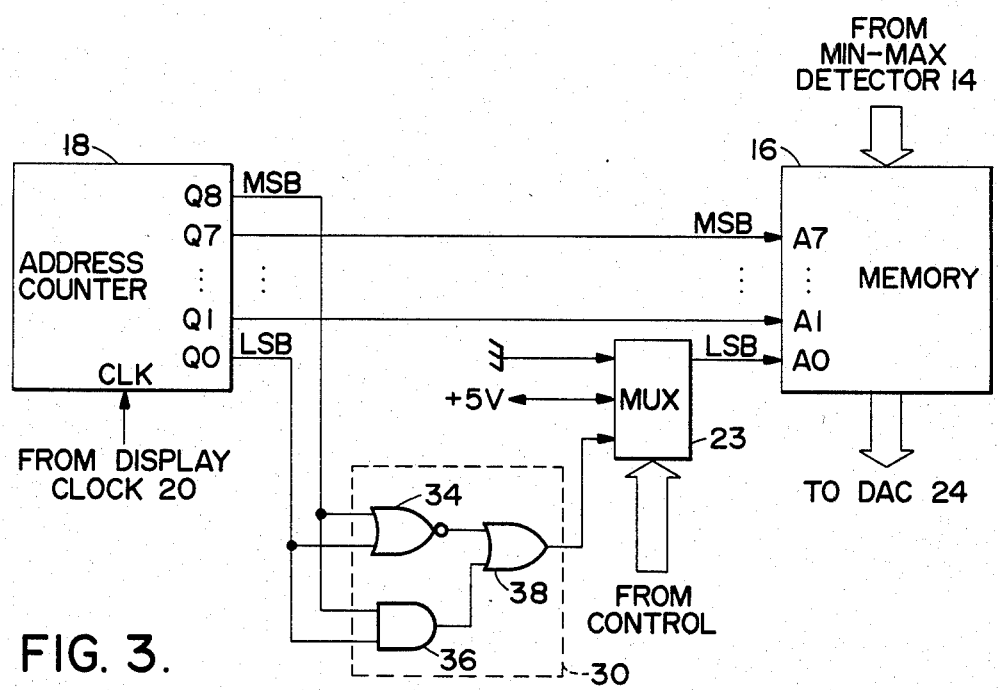
FIG. 3.

SIGNAL-ENVELOPE DISPLAY SYSTEM FOR A DIGITAL OSCILLOSCOPE

BACKGROUND OF THE INVENTION

This invention relates generally to display systems for digital oscilloscopes, and in particular to a system for reproducing the envelope of complex signals such as carrier signals.

Real-time oscilloscopes provide a continuous time-based display of the instantaneous amplitude values of electrical phenomena, and are thus able to accurately display the waveforms of complex signals, such as high-frequency carrier signals having low-frequency envelopes. These types of waveforms, as well as other types, are also displayable by real-time oscilloscopes equipped with direct-view bistable storage tubes because the signal processing circuits and recording medium are continuous. On the other hand, digital oscilloscopes chop input signals into time points determined by an internal clock, quantize the instantaneous amplitude values at those points, and store the resulting digital representations in digital memory. The display is regenerated from the memory at a predetermined clock rate, and is manifested either as a series of dots, or connected dots. Since the input signals are not functionally related to the internal clock of the digital oscilloscope, whatever the instantaneous value of the input signal happens to be when the clock edge occurs is what gets stored. The information between such points, of course, is lost, so that for complex signals, an intelligible waveform is difficult, if not impossible, to reconstruct.

In order to observe such complex signals, an envelope display system has been developed for digital oscilloscopes and is disclosed in U.S. Pat. No. 4,251,815 which is assigned to the assignee of the present invention. According to this system, the maximum and minimum amplitude values of repetitive waveform are determined by a max-min detector circuit, for example, such as that disclosed in U.S. Pat. No. 4,271,486 assigned to the assignee of the present invention. These maximum (M) and minimum (m) values are actually stored as the acquired data points along the waveform in place of the instantaneous values actually occuring at those points. Hence, the maximum and minimum data are stored in a digital memory interleaved (M, m, M, m . . . ), i.e., the maximum and minimum data are respectively stored in even and odd address locations in the memory. For the envelope display, in a first cycle, the data stored in the even and odd addresses of the memory are read so that the read-out data representing the maximum and minimum signal values are alternately displayed on a display device by use of an associated vector generator. The data stored in only the even addresses of the memory are read so that the maximum values are displayed on the display device in a second cycle, and the data stored in only the odd addresses are read for displaying the minimum values in a third cycle. The three resulting displays are superposed on the display device, which appears to an observer as a single display of the filled-in envelope of the complex waveform.

Since this conventional system requires three cycles through the memory to display the envelope waveform, it needs complex hardware, software and time expense. In addition, the conventional system also requires a complex averaging filter to draw semistraight vectors between the maximum and minimum points.

SUMMARY OF THE INVENTION

In accordance with the present invention, a simple signal envelope display system is provided for a digital oscilloscope. The same technique as the above-described conventional system is employed for detecting the maximum and minimum signal amplitudes occuring over short time increments and storing them in a digital memory interleaved. A binary address counter is connected to the memory to sequentially address each storage location in response to a display clock signal, and a control circuit is interposed between the address counter and the memory to control the least significant bit (LSB) of the address count signal thereby to provide two addressing cycles. On the first cycle through the memory, the control circuit does not control the LSB of the address signal from the address counter, so that the address signal is applied to the address terminals of the memory without processing. This cycle produces the data at the data output terminals of the memory in order of the maximum (M) and minimum (m) data (M, m, M. m, . . . ), assuming that the maximum and minimum data are respectively stored in the even and odd address locations and the address signal starts from "0000 0000" (in this instance, the address signal consists of eight bits). On the second cycle through the memory, the control circuit inverts only the LSB of the address signal, so that this cycle produces the data from the memory in order of the minimum and maximum data (m, M, m, M . . . ). Alternately passing these two sequences through a digital-to-analog converter, a low pass filter and a display amplifier produces a symmetrical envelope display with intensified upper and lower bounds and fully written center portion. Since the two superimposed waveforms are closely spatially related, they may be interlaced in a multiple waveform display without affecting display flicker. The present invention requires a simple low pass filter in place of a complex averaging filter.

It is therefore one object of the present invention to provide an improved signal envelope display system for a digital oscilloscope.

It is another object to provide an improved signal envelope display system which is simple and inexpensive in construction and requires only two cycles for the envelope display.

It is a further object to provide an improved signal envelope display system with less software.

Other objects and advantages of the present invention will become apparent upon a reading of the following description when taken in conjunction with the accompanying drawings.

BRIEF DESCRIPTION OF THE DRAWINGS

FIG. 1 is a block diagram of a first embodiment of a signal envelope system in accordance with the present invention;

FIGS. 2A–2E are waveforms associated with the block diagram of FIG. 1;

FIG. 3 is a block diagram of a part of a second embodiment in accordance with the present invention; and FIG. 4 is a block diagram of a part of a third embodiment in accordance with the present invention.

DETAILED DESCRIPTION OF THE PREFERRED EMBODIMENT

Referring to FIG. 1, a block diagram of a digital oscilloscope display is shown in which analog signals are applied via an input terminal 10 to a waveform acquisition circuit 12, which includes the well-known sample/hold and analog-to-digital converter circuits utilized by conventional digital oscilloscopes. While the number of points acquired along the waveform of an input signal are limited by available memory space, the waveform acquisition circuit 12 may suitably operate as taught in the above-mentioned U.S. Pat. No. 4,271,486, wherein a high speed sampling system acquires waveform data at the highest rate at which the analog-to-digital converter will operate. The waveform data thus acquired is applied to a min-max detector circuit 14, which detects and holds the lowest and highest signal values occurring over time increments corresponding to the time interval between data points, the number of which is mandated by the available memory space. Therefore, the stored data points comprise the maximum and minimum signal amplitudes which occur between the designated data points, rather than the actual instantaneous values occuring at those points. Since a display memory 16 is in a write mode in accordance with a write command signal from a control system (not shown) and the memory 16 receives a write address signal at address terminals A0–A7 (the write address lines are not shown), the maximum and minimum values from the min-max detector circuit 14 are stored in adjacent memory locations in the memory 16. In other words, for example, the maximum and minimum values are respectively stored in the even and odd address locations of the memory 16. The memory 16 may suitably be a random-access memory (RAM).

Count output terminals Q0–Q7 of a binary address counter 18 are connected to address terminals A0–A7 of memory 16 to sequentially address each storage location in response to a display clock signal from a display clock generator 20. In the conventional manner, the binary address counter 18 includes an output line for each binary count bit, arranged in descending order from the most significant bit (MSB;Q7) to the least significant bit (LSB, Q0). The address terminals A7 and A0 correspond to MSB and LSB, respectively. A switch 22 and a control circuit 30 are interposed between the counter 18 and memory 16 on the LSB line to select the LSB actually applied to the memory 16 from ground, a pull-up voltage or the control circuit 30 to provide three display modes. The control circuit 30 consists of a T flip-flop 32 and three logic gates 34, 36, and 38, wherein the T terminal of the flip-flop 32 receives the over-flow (OF) signal from the counter 18, and the Q output signal thereof is applied to one input terminal of NOR gate 34 and AND gate 36. The other input terminals of gates 34, and 36 receive the LSB from the counter 18, and the output signals therefrom are applied to OR gate 38 of which the output terminal is connted to a contact 22C of the switch 22.

In the display mode, the memory 16 receives a read command signal from the control system. For the first display mode, the LSB input line (A0) of the memory 16 is connected to ground through the switch 22 and a contact 22A. In this mode, every other memory location, for example, even locations where only the maximum values are stored, is addressed sequentially, causing all of the maximum values to be clocked out of memory in succession. A digital-to-analog converter 24 and a low-pass filter 26 produce the connected-dot display signal of the maximum values as shown in FIG. 2A to be applied to a display device 28, which may suitably be a cathode ray tube. The low-pass filter 26 comprises an operational amplifier 26A, an input resistor 26B and a feedback circuit consisting of capacitor 26C and resistor 26D.

For the second display mode, the LSB input line (A0) of the memory 16 is connected to the pull-up voltage, e.g., +5 volts, through the switch 22 and a contact 22B. In this mode, every other memory location, for example, odd locations where only minimum values are stored, is addressed sequentially, causing all of the minimum values to be clocked out of the memory 16 in succession. The DAC 24 and the low-pass filter 26 produce the connected-dot display signal of the minimum values as shown in FIG. 2B.

The first and second display modes are disclosed in the above-mentioned U.S. Pat. No. 4,251,815, which further discloses producing the connected maximum-minimum waveform of FIG. 2C by permitting the LSB (Q0) of the counter 18 to be connected to the address terminal A0 of the memory 16 to address each memory location sequentially. It should be noted that a complex vector generator is required for the connected maximum-minimum waveform instead of the low-pass filter 26. According to this conventional system, the three resulting display waveforms (FIGS. 2A, 2B and 2C) are superposed on the display screen of display device 28, which appears to an observer as a single display of the filled-in envelope of a complex waveform as shown in FIG. 2D. The conventional system has some disadvantages as described hereinabove.

On the other hand, according to the third display mode of the present invention, the switch 22 is connected to a contact 22C. On the first cycle, the Q output of the flip-flop 32 is "0" (Low), since the over-flow signal (OF) is not generated yet by the address counter 18. The output from AND gate 36 is "0" regardless of the LSB from the counter 18, and thus the LSB (Q0) from the counter 18 is inverted by the control circuit 30 before the application to the LSB (A0) of the memory 16. In other words, the address signal is applied to the memory 16 in the order of "0000 0001", "0000 0000", "0000 0011", "0000 0010" … "1111 1111", "1111 1110". This cycle produces the output sequence (m, M, m, M . . .), where "m" and "M" represent the minimum and maximum respectively. When the address counter 18 generates the over-flow signal at the end of the first cycle, i.e., the output of the counter 18 is "1111 1111", the Q output of the flip-flop 32 changes to "1" (High) and the output from the NOR gate 34 is "0" regardless of the LSB from the counter 18. Thus, on the second cycle, the control circuit 30 permits the LSB of the counter 18 to pass to the memory 16, and the LSB (A0) of the memory 16 is identical to the LSB (Q0) of the counter 18. Each memory location of the memory 16 is addressed sequentially, so that the second cycle produces the sequence (M, m, M, m . . . ). When the counter 18 generates the over-flow signal at the end of the second cycle, the control circuit 30 returns to the first cycle. These two cycles are repeated. Alternately passing these two sequences through the DAC 24 and low-pass filter 26 produces on the display device 28 a symmetrical envelope display with intensified upper and lower bounds and fully written center portion as shown in FIG. 2E. It should be noted that the present invention requires only two cycles for the signal-envelope display. Also, since the two superimposed waveforms are closely spatially related, they may be interlaced in a multiple waveform display without affecting display flicker.

FIG. 3 is a block diagram of a part of a second embodiment according to the present invention, wherein this embodiment is similar to that of FIG. 1 so that the same reference numbers have been employed to designate like parts and only the differences will be discussed. The address counter 18 is a nine bit counter instead of the eight bit counter, and one input terminal of each of the gates 34 and 36 receives the MSB (Q8) of the counter 18 instead of the Q output of the flip-flop 32. Since the MSB (Q8) of the counter 18 is "0" during one half of a counting cycle and is "1" during the other half of the counting cycle, the control circuit 30 operates similarly fo FIG. 1. A digital multiplexer (MUX) 23 acts as the switch 22 and is controlled in accordance with a control signal. It is not required to switch the connection between the input and output of the MUX 23 for each display mode, the MUX 23 may be a low speed device.

FIG. 4 is a block diagram of another embodiment of the control circuit 30 in accordance with the present invention. An inverter 40 receives the LSB from the address counter through a terminal 42. A multiplexer (MUX) 44 selects the output of the inverter 40 or the terminal 42 in accordance with a control signal at a terminal 46 which may be the Q output signal from the flip-flop 32 of FIG. 1 or the MSB of the counter 18 of FIG. 3. The selected output from the MUX 44 is applied through a terminal 48 to the contact 22C of FIG. 1 or the MUX 23 of FIG. 3.

It will be obvious to those having ordinary skill in the art that many changes may be made in the above-described details of the preferred embodiments of the present invention without departing from the spirit and scope of the present invention. For example, the LSB of the address counter may be noninverted and inverted alternately for one display clock cycle by applying the clock signal to the T terminal of the flip-flop 32 in FIG. 1, the other input terminals of the NOR and AND gates 34 and 36 in FIG. 3, and the terminal 46 in FIG. 4. The low-pass filter may be a passive filter. Therefore, the scope of the present invention should be determined only by the following claims.

What we claim as being novel is:

1. A display system for a digital oscilloscope in which for each spaced interval along a signal waveform a maximum and a minimum amplitude value are obtained to provide a sequence of max-min value pairs, comprising:

memory means for storing ordered pairs of said maximum and minimum amplitude values such that said max-min pairs are stored in adjacent addressable storage locations;

address counter means for providing a binary address count signal consisting of binary bits to address said memory means sequentially to retrieve said maximum and minimum values;

control circuit means for selectively inverting the least significant bit of the address count signal thereby transposing the order of maximum and minimum values in each max-min value pair being retrieved from said memory means;

means responsive to the retrieved sequence of max-min value pairs for generating a display signal therefrom.

2. A display system in accordance with claim 1, wherein said control circuit means comprises in combination a NOR gate, an AND gate, and an OR gate, each gate having a first and second input and an output; wherein the outputs of said NOR gate and said AND gate are connected respectively to the first and second inputs of said OR gate, and the output of said OR gate is connected to a least significant bit address terminal of said memory means; and further wherein the first inputs of said NOR gate and said AND gate are connected together to the least significant bit output of said address counter means, and the second inputs of said NOR gate and said AND gate are connected together to a control signal input.

3. A display system in accordance with claim 1, wherein said control circuit means comprises a multiplexer having a first input connected to the least significant bit output of said address counter means, and a second input connected to a output of an inverter whose input is also connected to the least significant bit output of said address counter means, wherein the output of said multiplexer is connected to the least significant bit address terminal of said memory means, and further wherein a control signal generated in response to a predetermined count from said address counter means is applied to said multiplexer to control input selection thereof.

4. A display system in accordance with claim 1, wherein said means for generating a display signal comprises a digital-to-analog converter for converting said retrieved sequence of max-min value pairs to analog values, and a low-pass filter connected to an output of said digital-to-analog converter for generating a signal which connects said analog values.

5. A display system in accordance with claim 2, wherein said control signal input connected to said second inputs of said NOR gate and said AND gate is generated in response to a predetermined count from said address counter means.

\* \* \* \* \*